United States Patent
Tuttle

(10) Patent No.: US 6,625,040 B1
(45) Date of Patent: Sep. 23, 2003

(54) SHIELDED PC BOARD FOR MAGNETICALLY SENSITIVE INTEGRATED CIRCUITS

(75) Inventor: Mark Tuttle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 8 days.

(21) Appl. No.: 09/653,558

(22) Filed: Aug. 31, 2000

(51) Int. Cl.[7] ................................. H05K 9/00
(52) U.S. Cl. .................. 361/816; 361/762; 361/800; 361/803; 361/818; 174/35 R; 174/255; 257/659
(58) Field of Search ........................ 361/748, 762, 361/777, 800, 816, 818, 803; 174/35 R, 255, 256; 257/659

(56) References Cited

U.S. PATENT DOCUMENTS

| | | | |
|---|---|---|---|
| 3,398,232 A * | 8/1968 | Hoffman ................... 174/254 |
| 4,209,848 A | 6/1980 | Braun et al. |
| 4,498,122 A * | 2/1985 | Rainal ...................... 361/794 |
| 4,926,546 A | 5/1990 | Polczynski et al. |
| 4,953,002 A | 8/1990 | Nelson et al. |
| 4,954,929 A * | 9/1990 | Baran ...................... 361/794 |
| 5,023,753 A * | 6/1991 | Abe ......................... 361/782 |
| 5,136,471 A * | 8/1992 | Inasaka .................... 361/794 |
| 5,275,975 A | 1/1994 | Baudouin et al. |
| 5,280,413 A * | 1/1994 | Pai ........................... 361/792 |
| 5,297,007 A * | 3/1994 | Deyo et al. ............... 361/707 |
| 5,483,413 A * | 1/1996 | Babb ........................ 361/220 |
| 5,561,265 A * | 10/1996 | Livshits et al. ........ 174/35 GC |
| 5,764,491 A * | 6/1998 | Tran ......................... 361/794 |
| 5,902,690 A | 5/1999 | Tracy et al. |
| 6,195,244 B1 * | 2/2001 | Barz ......................... 361/111 |

* cited by examiner

Primary Examiner—Jayprakash N. Gandhi
(74) Attorney, Agent, or Firm—Dickstein Shapiro Morin & Oshinsky LLP

(57) ABSTRACT

A method and packaging device which provide a magnetically permeable shield for integrated circuits containing magnetic field sensitive circuit elements are disclosed. One or more magnetic shields are provided on, or embedded within, a printed circuit board and additional shielding elements are provided over the printed circuit board.

34 Claims, 1 Drawing Sheet

SHIELDED PC BOARD FOR MAGNETICALLY SENSITIVE INTEGRATED CIRCUITS

FIELD OF THE INVENTION

The present invention relates to a shielded printed circuit board for mounting integrated circuits which are sensitive to external magnetic fields.

BACKGROUND OF THE INVENTION

Recently, very high-density magnetic memories, such as magnetic random access memories (MRAMs), have been proposed as storage devices for digital systems. Magnetic random access memories employ one or more ferromagnetic films as storage elements. A typical multilayer-film MRAM includes a plurality of bit or digit lines intersected by a plurality of word lines. At each intersection, a ferromagnetic memory element is interposed between the corresponding bit line and word line to form a storage cell.

When in use, an MRAM cell stores information as digital bits, the logic value of which depends on the states of magnetization of the thin magnetic multilayer films forming each memory cell. As such, the MRAM cell has two stable magnetic configurations, high resistance representing, for example, a logic state 0 and low resistance representing, for example, a logic state 1. The magnetization configurations of the MRAMs depend in turn on the magnetization vectors which are oriented as a result of electromagnetic fields applied to the memory cells. The electromagnetic fields used to read and write data are generated by associated CMOS circuitry. However, stray magnetic fields, which are generated external to the MRAM, may cause errors in memory cell operation when they have sufficient magnitude.

Very high-density MRAMs are particularly sensitive to stray magnetic fields mainly because the minuscule MRAM cells require relatively low magnetic fields which generate magnetic vectors used in read/write operations. These magnetic vectors are, in turn, easily affected and have a magnetic orientation which can be changed by such external stray magnetic fields.

To diminish the negative effects of the stray magnetic fields and to avoid lo sensitivity of MRAM devices to stray magnetic fields, the semiconductor industry could produce memory cells requiring higher switching electromagnetic fields than a stray field which the memory cells would typically encounter. However, the current requirements for operating such memory cells is greatly increased because higher internal fields necessitate more current. Thus, both the reliability and scalability of such high current devices decrease accordingly, and the use of MRAMs which may be affected by stray magnetic fields becomes undesirable.

Accordingly, there is a need for an improved magnetic memory shielding which reduces the effects of external magnetic fields on internal memory cell structures and operations, as well as a method for fabricating such magnetic shielding. There is further a need for minimizing the cost of shielding a magnetic random access memory IC chip from external magnetic fields.

SUMMARY OF THE INVENTION

The present invention provides a method and apparatus which provide a shielding structure for a printed circuit board supporting magnetic field sensitive integrated circuits, such as MRAMs, which shield such circuits from external magnetic fields. The invention employs one or more magnetic shields, preferably formed of non-conductive magnetic oxides, which are on, or embedded within, a printed circuit board and, optionally, an additional magnetic shielding structure which surrounds and covers integrated circuit chips mounted on the printed circuit board.

These and other features and advantages of the invention will be more clearly apparent from the following detailed description which is provided in connection with accompanying drawings and which illustrates exemplary embodiments of the invention.

DETAILED DESCRIPTION OF THE EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The present invention provides a printed circuit board assembly which shields magnetic memory structures, such as MRAMs, from external stray magnetic fields. The invention employs one or more magnetically permeable shielding layers, preferably formed of electrically non-conductive magnetic oxides, which are provided on, or embedded within, a printed circuit board. Magnetic shielding material may also surround integrated circuit chips which include such magnetic memory structures and which are supported by the printed circuit board.

Figure 1:
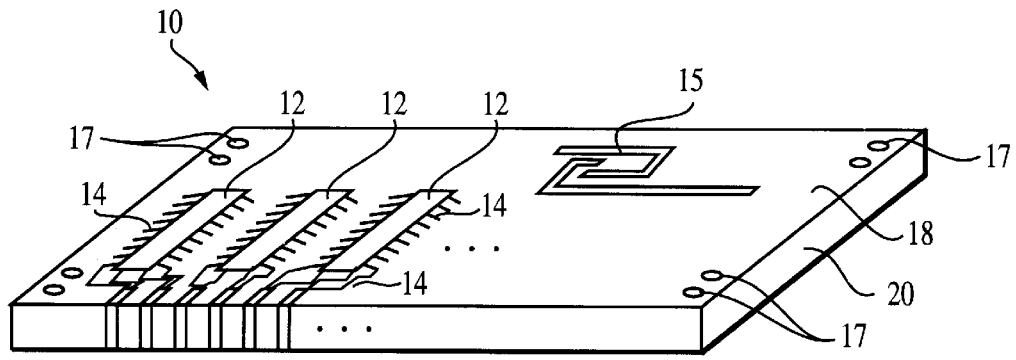
FIG. 1 is a perspective view of a printed circuit board assembly with surface-mounted integrated circuits.

Referring now to the drawings, where like elements are designated by like reference numerals, FIGS. 1–4 illustrate exemplary embodiments of the present invention. FIG. 1 depicts a printed circuit board assembly 10 which includes an array of surface-mounted magnetically sensitive integrated circuits 12 which, in turn, include internal electromagnetic structures, such as MRAM cells and access circuitry. The integrated circuits 12 also include conductive leads 14 that are attached to a plurality of electrically conductive patterns 15. The electrically conductive patterns 15 are laid out on a top surface 18 (or on internal layers) of a printed circuit board 20.

Figure 2:
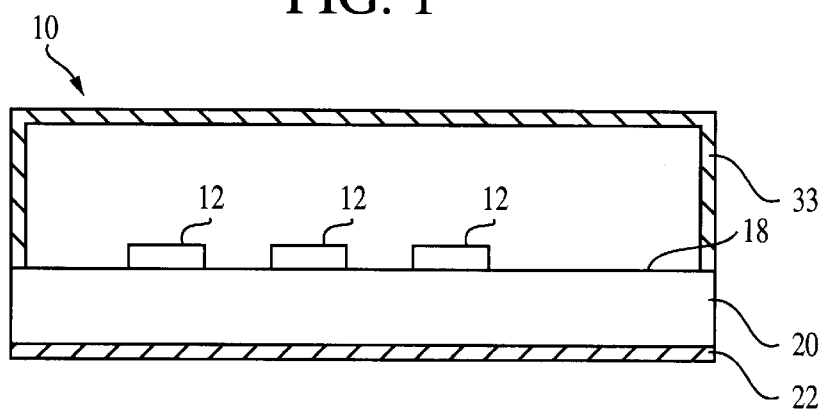
FIG. 2 is a cross-sectional view of the printed circuit board assembly of FIG. 1 at a subsequent stage of processing to that shown in FIG. 1 and in accordance with a first embodiment of the present invention.

Referring now to FIG. 2, which for simplicity illustrates only a cross-sectional view of the printed circuit board assembly 10 of FIG. 1, a magnetic shield is provided for shielding the integrated circuits 12 from external magnetic field disturbances. According to an exemplary embodiment of the present invention, a magnetic shielding layer 22 is formed on the bottom surface of the printed circuit board 20, that is the surface that is opposite to the top surface 18 that directly supports the integrated circuits 12.

The magnetic shielding layer 22 is formed of a magnetically permeable shielding material which comprises, for example, an electrically non-conductive material with permeability higher than that of air or silicon. As such, the preferred choice for the magnetic shielding material is a non-conductive magnetic oxide, for example, a ferrite such as $MFe_2O_4$, wherein M=Mn, Fe, Co, Ni, Cu, or Mg, among others. Manganites, chromites and cobaltites may be used also, depending on the device characteristics and specific processing requirements. Further, the magnetic shielding layer 22 may also comprise conductive magnetic particles, for example nickel, iron or cobalt particles, which are incorporated into a non-conductive base material, such as a glass sealing alloy or polyimide. Also, the magnetic shielding layer 22 may also comprise conductive magnetic materials, such as nickel, iron, cobalt, Permalloy, or Mumetals, among others.

The printed circuit board 20 with the integrated circuits 12 may also be surrounded with a magnetic shielding packaging material 33 (FIG. 2), which may be similar to, or different than, the magnetic shielding material for the magnetic shielding layer 22. In any event, the magnetic shielding packaging material 33 may be formed of a non-conductive magnetic oxide, for example a ferrite such as $MFe_2O_4$, wherein M=Mn, Fe, Co, Ni, Cu, or Mg, among others. However, manganites, chromites and cobaltites may be used also, depending on the device characteristics and processing requirements. Further, conductive Mumetal alloys comprising approximately 77% nickel (Ni), 4.8% copper (Cu), 1.5% chromium (Cr) and 14.9% iron (Fe) may be used also, as well as conductive magnetic particles, such as nickel, iron or cobalt particles, incorporated into a base material, for example a glass sealing alloy, a polyimide, or a polymer.

In addition, the magnetic shielding packaging material 33 may also comprise a mold compound, such as a plastic compound, with conductive magnetic particles therein. For example, conductive magnetic particles of, for example, nickel, iron, and/or cobalt, may be suspended in a matrix material, such as a plastic compound, at a concentration that does not allow the particles to touch each others. Alternatively, the packaging material 33 may comprise a mold compound, such as a plastic compound, including non-conductive particles of, for example, non-conductive magnetic oxides and/or Mumetal alloys.

The magnetic shielding packaging material 33 surrounds the integrated circuits 12 of the printed circuit board 20, so that the integrated circuitry including magnetic memory structures, such as MRAMs, are shielded by the magnetic shielding layer 22 and surrounded in the magnetic shielding packaging material 33 for maximum protection from external stray magnetic fields.

Figure 3:
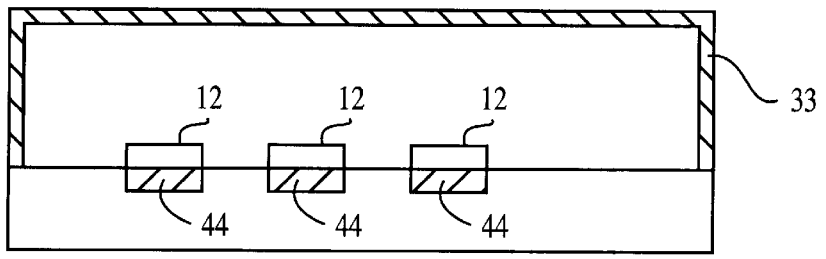
FIG. 3 is a cross-sectional view of the printed circuit board assembly of FIG. 1 at a subsequent stage of processing to that shown in FIG. 1 and in accordance with a second embodiment of the present invention.

Although FIG. 2 shows the magnetic shielding material in the form of the layer 22 on the back side of the printed circuit board 20, it is also possible to apply a continuous or patterned layer of shielding material on the top surface 18 of the printed circuit board 20, provided it is arranged so that it does not interfere with the electrical connections on the printed circuit board 20. Thus, as shown in FIG. 3, a top magnetic shielding layer 44 can be formed and patterned on the top surface 18 of the printed circuit board 20 so that portions of magnetic shielding layer 44 are formed beneath the integrated circuits 12.

Figure 4:
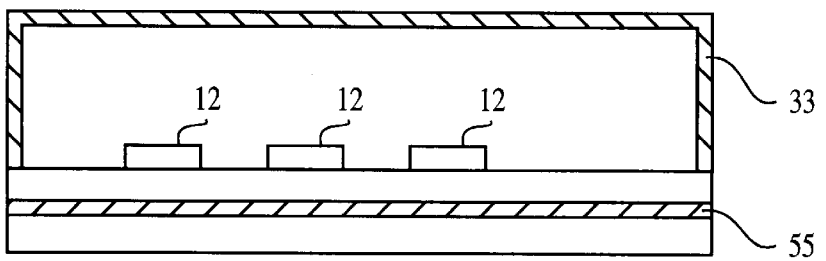
FIG. 4 is a cross-sectional view of the printed circuit board assembly of FIG. 1 at a subsequent stage of processing to that shown in FIG. 1 and in accordance with a third embodiment of the present invention.

FIG. 4 illustrates yet another exemplary embodiment of the present invention, in which a flat magnetic shielding layer 55 is embedded within the printed circuit board 20, which can be otherwise formed of a resin compound, for example, or other known printed circuit board material. The material for the flat magnetic shielding layer 55 may be similar to, or different than, that of the magnetic shielding layer 22 and the shielding packaging material 33. In any event, the preferred material for the flat magnetic shielding layer 55 is a non-conductive magnetic oxide, for example a ferrite such as $MFe_2O_4$, wherein M=Mn, Fe, Co, Ni, Cu, or Mg, among others.

Although the exemplary embodiments described above refer to specific magnetic shielding materials, it must be understood that the invention is not limited to the materials described above, and other magnetic shielding materials, such as ferromagnetics like nickel-iron (Permalloy), cobalt-nickel-iron, nickel or iron may be used also.

Further, although the exemplary embodiments described above refer to specific locations where the shielding material is applied to a printed circuit board, it is also possible to selectively apply the shielding material at desired locations, for example, corresponding to below or above the locations of the integrated circuits 12. In addition, the shielding material shown in the various embodiments may be used alone or in combination. For example, two or more layers of material could be employed for shielding the magnetic memories structures, one on each surface of the printed circuit board 20, or multiple layers of the same or different shielding material which overlap each other may be used on one or both surfaces of the printed circuit board 20, or on one surface and in between the surfaces of the printed circuit board 20. Moreover, the specific shape of the shielding material is not limited to that shown in FIGS. 2–4 and other shapes, configurations, or geometries may be employed, particularly for the magnetic shielding packaging material 33.

The present invention is thus not limited to the details of the illustrated embodiments and the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A printed circuit board for supporting integrated circuits sensitive to external magnetic fields, said printed circuit board comprising:

a support body having at least one surface containing locations for supporting at least one magnetic memory structure of said integrated circuits; and a magnetically shielding structure coupled to said support body for shielding at least one surface of said integrated circuits supported on said support body, wherein said magnetically shielding structure comprises one or more separate layers of electrically non-conductive magnetic material, each of said layers coupled to a surface of said support body, said one or more separate layers forming a discontinuous shield of integrated circuits.

2. The printed circuit board of claim 1, wherein said magnetically shielding structure shields top and bottom surfaces of said integrated circuits supported on said support body.

3. The printed circuit board of claim 1, wherein said magnetically shielding structure comprises at least one layer of magnetic shielding material located on said first surface of said support body.

4. The printed circuit board of claim 1, wherein said magnetic material comprises $MFe_2O_4$, wherein M is at least one atom selected from the group consisting of Mn, Fe, Co, Ni, Cu, and Mg.

5. The printed circuit board of claim 1, wherein said magnetic material comprises a material which includes conductive particles.

6. The printed circuit board of claim 5, wherein said magnetic material comprises a material which includes nickel particles.

7. The printed circuit board of claim 5, wherein said magnetic material comprises a material which includes cobalt particles.

8. The printed circuit board of claim 5, wherein said magnetic material comprises a material which includes iron particles.

9. The printed circuit board of claim 1, further comprising at least one of said integrated circuits mounted on said support body.

10. The printed circuit board of claim 1, wherein said magnetic memory structure is a magnetic random access memory device.

11. The printed circuit board of claim 1, wherein said support body is a memory module support.

12. The printed circuit board of claim 11, wherein said memory module support has plug in connectors on at least one edge.

13. The printed circuit board of claim 1, wherein said magnetically shielding structure is patterned to underlie said locations for supporting said integrated circuits.

14. The printed circuit board of claim 1, wherein said magnetically shielding structure is patterned to be positioned over said locations for supporting said integrated circuits.

15. The printed circuit board of claim 1, wherein said magnetic material is selected from the group consisting of ferrites, manganites, chromites, and cobaltites.

16. The printed circuit board of claim 1, wherein said magnetically shielding structure coupled to said support body encloses a plurality of integrated circuits sensitive to external magnetic fields.

17. The printed circuit board of claim 16, wherein said magnetically shielding structure further comprises one or more separate layers of electrically non-conductive magnetic material formed under each of said integrated circuits.

18. A printed circuit board for supporting integrated circuits sensitive to magnetic fields, said printed circuit board comprising:
   a support body for supporting at least one magnetic random access memory structure of said integrated circuits; and
   a magnetically shielding structure coupled to said support body for shielding at least one surface of said integrated circuits supported on said support body, wherein said magnetically shielding structure comprises one or more separate layers of electrically non-conductive magnetic material, each of said layers coupled to a surface of said support body, said one or more separate layers forming a discontinuous shield for said integrated circuits.

19. The printed circuit board of claim 18, wherein said magnetic material comprises $MFe_2O_4$, wherein M is at least one atom selected from the group consisting of Mn, Fe, Co, Ni, Cu, and Mg.

20. The printed circuit board of claim 18, wherein said magnetic material comprises a material which includes conductive particles.

21. The printed circuit board of claim 20, wherein said conductive particles are selected from the group consisting of nickel particles, cobalt particles and iron particles.

22. The printed circuit board of claim 18, wherein said magnetic material is selected from the group consisting of ferrites, manganites, chromites, and cobaltites.

23. The printed circuit board of claim 18, wherein said magnetically shielding structure coupled to said support body encloses a plurality of integrated circuits sensitive to external magnetic fields.

24. A method of packaging a semiconductor device comprising:
   electrically coupling at least one integrated circuit sensitive to magnetic fields to a printed circuit board, said printed circuit board having at least one surface containing locations for supporting said integrated circuit;
   contacting at least one surface of said printed circuit board with a magnetically shielding material formed of one or more separate layers of electrically non-conductive material said one or more separate layers forming a discontinuous shield for said integrated circuit, said magnetically shielding material shielding at least one surface of said integrated circuit from external magnetic fields;
   forming at least one layer of said magnetically shielding material embedded within said printed circuit board; and
   mounting an integrated circuit chip of said integrated circuit on said printed circuit board, said integrated circuit chip containing a magnetic memory structure which may be affected by external magnetic fields.

25. The method of claim 24, wherein said act of contacting said printed circuit board with said magnetically shielding material includes shielding top and bottom surfaces of said integrated circuit with said magnetically shielding material.

26. The method of claim 24, wherein said magnetically shielding material comprises a magnetic material selected from the group consisting of ferrites, manganites, chromites and cobaltites.

27. The method of claim 24, wherein said magnetic material comprises $MFe_2O_4$, wherein M is at least one atom selected from the group consisting of Mn, Fe, Co, Ni, Cu, and Mg.

28. The method of claim 24, wherein said magnetic material comprises a material which includes conductive particles.

29. The method of claim 28, wherein said conductive particles are selected from the group consisting of nickel particles, iron particles and cobalt particles.

30. The method of claim 24 further comprising the act of patterning said magnetically shielding material to form a magnetically shielding pattern underlying said locations for supporting said integrated circuits.

31. The method of claim 24 further comprising the act of patterning said magnetically shielding material to form a magnetically shielding pattern overlying said locations for supporting said integrated circuits.

32. The method of claim 24, wherein said magnetic memory structure is a magnetic random access memory device.

33. The method of claim 24, wherein said magnetically shielding material encloses a plurality of integrated circuits sensitive to external magnetic fields.

34. The method of claim 33, wherein said magnetically shielding material further comprises one or more separate layers of electrically non-conductive magnetic material formed under each of said integrated circuits.

* * * * *

UNITED STATES PATENT AND TRADEMARK OFFICE
CERTIFICATE OF CORRECTION

PATENT NO.    : 6,625,040 B1
DATED         : September 23, 2003
INVENTOR(S)   : Mark Tuttle It is certified that error appears in the above-identified patent and that said Letters Patent is hereby corrected as shown below:

<u>Column 5,</u>
Lines 1-4, replace Claim 3 with:
    3. The printed circuit board of claim 1, wherein said magnetically shielding structure comprises at least one layer of magnetic shielding material embedded within said support body.

Signed and Sealed this

Thirteenth Day of January, 2004

JON W. DUDAS
*Acting Director of the United States Patent and Trademark Office*